Nov. 10, 1959 A. B. JACOBSEN ET AL 2,912,571

RADIO RECEIVER WITH SQUELCH MEANS IN AUDIO SECTION AND BATTERY SAVER IN OUTPUT CIRCUIT

Filed April 19, 1955

INVENTORS
Andrew B. Jacobsen
BY Angus A. Macdonald
Mueller & Aichele
Attys.

United States Patent Office 2,912,571
Patented Nov. 10, 1959

2,912,571

RADIO RECEIVER WITH SQUELCH MEANS IN AUDIO SECTION AND BATTERY SAVER IN OUTPUT CIRCUIT

Andrew B. Jacobsen, Phoenix, Ariz., and Angus A. Macdonald, Hinsdale, Ill., assignors to Motorola, Inc., Chicago, Ill., a corporation of Illinois Application April 19, 1955, Serial No. 502,483
2 Claims. (Cl. 250—20)

This invention relates generally to amplifier circuits and more particularly to an amplifier circuit which utilizes a minimum of energy and which is fully conductive in the presence of a signal to amplify the same.

In many applications, amplifiers are operated continuously even though signals are applied to the amplifier only intermittently. As an example, radio receivers are commonly energized continually to receive messages which might be transmitted thereto, but actually messages are transmitted only a small part of the time. In some of these applications, the use of power by the receiver is relatively critical and it is desired to minimize the power consumed. To accomplish this, timing circuits have been used which operate amplifiers or receivers only intermittently and which operate in the presence of a signal to continuously energize the amplifier. However, in such cases for effective reduction in energy, the time interval between the operations must be made relatively long, and in such case a part of the message may be lost while the receiver is unenergized.

It is, therefore, an object of the present invention to provide a simple energy saving circuit for an amplifier which is continuously operated, but to which signals are only intermittently applied.

A further object of the invention is to provide a bias circuit for an amplifier which substantially cuts off the tube of the amplifier under normal conditions and which bias is automatically reduced when a signal is applied to the amplifier so that the amplifier conducts fully to provide substantial amplification of the signals.

A further object of the invention is to provide a radio receiver having a squelch circuit for quieting the receiver when no signal is being transmitted and a system for automatically reducing the energy of the audio amplifier of the receiver when no audio signal is applied thereto.

A feature of the invention is the provision of an amplifier stage including a vacuum tube having a control grid to which signals may be applied, with a circuit normally applying a negative bias to the tube which substantially cuts the tube off so that only a small plate current is drawn, which circuit includes a rectifier to which the signal is applied to provide a voltage which opposes the negative bias to render the tube conducting to amplify a signal applied thereto.

Another feature of the invention is the provision of a radio receiver including a limiter stage and an audio output stage for amplifying audio signals derived from the carrier wave which passes through the limiter stage, with the limiter stage applying a negative voltage to the audio amplifier stage to normally render the tube thereof substantially cut off, and with the output of the audio amplifier stage providing a positive voltage which opposes the negative voltage from the limiter so that the audio amplifier stage is rendered conducting when an audio signal is applied thereto.

Still another feature of the invention is the provision of a frequency modulation receiver which is continuously operable and which includes a squelch circuit for blocking the audio circuit when no signal is being transmitted, wherein the receiver includes an audio output stage which draws heavy current when amplifying a signal, with the output stage including a biasing circuit for providing a negative voltage thereto which renders the tube substantially non-conducting to thereby subsantially reduce the current drawn thereby, and a rectifier circuit which provides a positive voltage in response to an audio signal to be amplified to counteract the negative bias so that the output tube conducts heavily to amplify the signal applied thereto.

Further objects, features and the attending advantages of the invention will be apparent from the consideration of the following description when taken in connection with the accompanying drawings in which.

In practicing the invention, there is provided an amplifier stage which may be the final audio stage of a radio receiver. Audio signals are applied to the control grid of the tube of the audio output stage and the amplified signals therefrom are applied from the anode thereof to a sound reproducing device such as a loud speaker. A bias circuit is also connected to the control grid including means for normally applying a negative voltage to the control grid which renders the tube substantially cut off. This negative voltage may be derived from a preceding stage of the receiver such as from the grid of a limiter stage in a high gain receiver. The bias circuit includes a rectifier to which the signal is applied and which produces a positive voltage which opposes the negative voltage so that the bias applied to the control grid is rendered less negaive and the tube therefore conducts. Accordingly, the output tube will draw heavy current only when a signal is applied thereto. The rectifier circuit may be coupled to the output of the audio output stage or to the input hereof. Although this amplifier is suitable for use in many applications, it is particularly applicable for use in a frequency modulation receiver having a squelch circuit which normally blocks the audio circuits when no signal is received.

Figure 1:
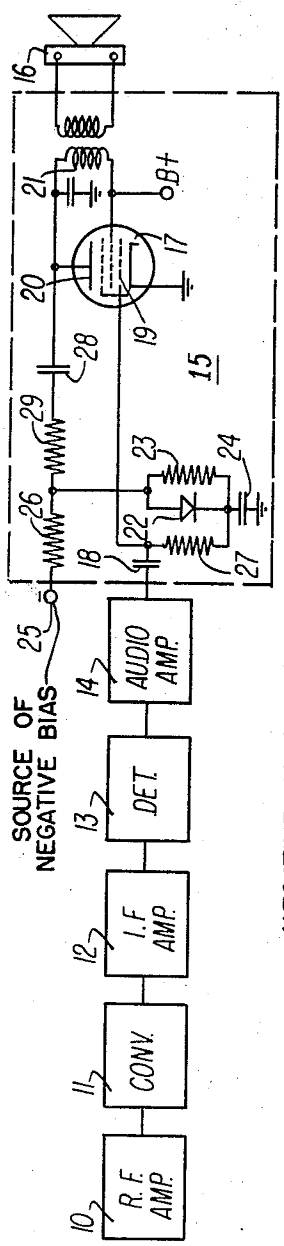
Fig. 1 illustrates a radio receiver including the amplifier circuit in accordance with the invention.

Referring now to the drawings, in Fig. 1 there is shown a radio receiver with the stages prior to the audio output stage being shown in block diagram form. A radio frequency circuit 10 may include an antenna or other signal receiving means together with selecting and/or amplifying means. The signal selected by the radio frequency stage is applied to converter stage 11 which may reduce the frequency thereof, with the reduced frequency being amplified by the intermediate frequency amplifier 12. As will be set forth more fully, the intermediate frequency amplifier may include stages which limit the signal. The intermediate frequency signal is applied to detector 13 which derives the modulation from the intermediate frequency wave. The receiver may be either an amplitude modulation receiver or a frequency modulation receiver, with the detector being of the type required to demodulate the wave applied thereto. The output from the detector is applied to a first audio amplifier stage 14 which may include control means for controlling the level of the audio signal. The output of the audio amplifier stage 14 is applied to the audio output stage 15 which amplifies the signal and applies the same to a loud speaker or other reproducing device 16.

Considering now the audio output stage 15, this stage includes an electron discharge valve 17 which may be of the pentode type as shown. The audio signal is applied through condenser 18 to the grid of the tube 19. The output from the tube is derived from the plate 20 and applied to transformer 21 which is coupled to the loudspeaker 16. A biasing circuit is provided for the tube 17 including rectifier 22, resistor 23 and condenser 24. A negative voltage from a point 25 is applied to the biasing circuit through resistor 26. This causes the condenser 24 to charge to a negative value so that a negative voltage is applied through resistor 27 through the control grid 19. This negative voltage may be of the order of 20 volts which is effective to substantially render a tube of the pentode type (such as 6AQ5) cut off so that very small plate current flows therein. Also included in the biasing circuit is a condenser 28 and resistor 29 connected in series from the anode 20 of the tube 17 to the rectifier 22.

The tube 17 is normally conducting to a small extent so that when an audio signal is applied from the amplifier 14 through condenser 18 to the grid 19, a small signal will be developed at the anode 20. This signal will be applied through condenser 28 and resistor 29 and rectified by rectifier 22 to produce a positive voltage across condenser 24. This reduces the negative voltage normally appearing across condenser 24 which is applied through resistor 27 to grid 19 so that the tube 17 conducts slightly more. This will increase the output at the anode 20 to in turn increase the rectified voltage, with the action continuing until the negative voltage on the grid 19 is reduced to a point where the tube 17 conducts fully. This action will take place quite rapidly so that the tube 17 is, in effect, immediately conducting when an audio signal is applied thereto.

Accordingly, it will be seen that the tube 17 draws only very small plate current when no audio signal is applied, but draws full current to provide full amplification when an audio signal is applied. Since the audio output stage of a receiver draws a large part of the receiver plate current, the reduction in current by the system shown is substantial, particularly in receivers wherein signals are received only a very small part of the time. Although the amplifier is described as the audio output amplifier of a radio receiver, it is apparent that such an amplifier could be used in other applications wherein it was necessary to have a unit continually available, but to which signals are applied only a part of the time.

Figure 2:
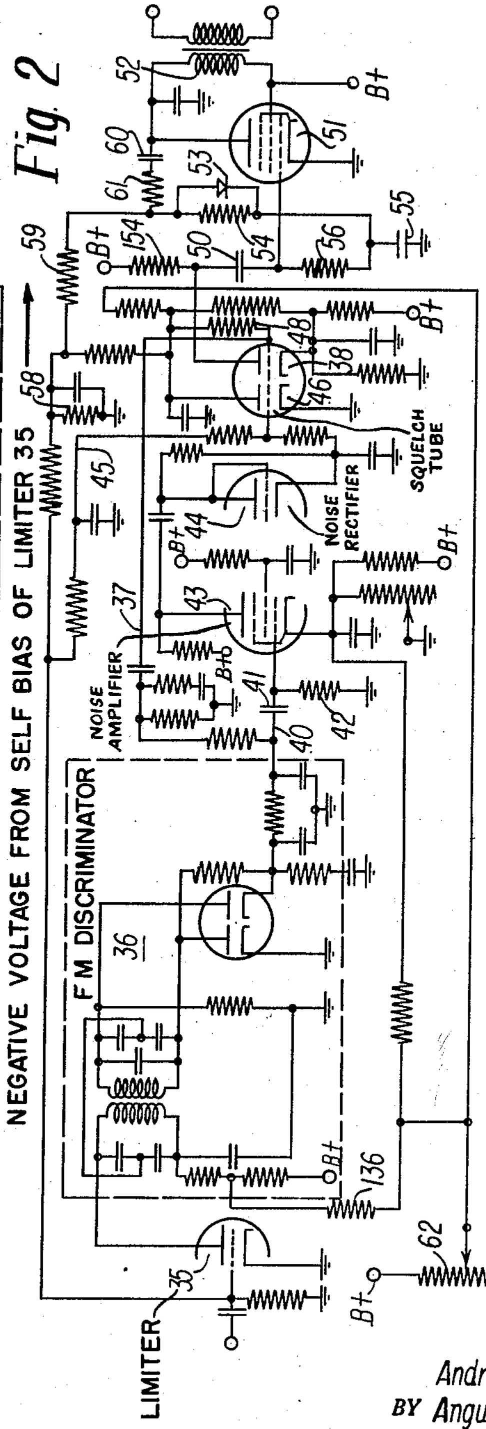
Fig. 2 is a circuit diagram of portions of the receiver of Fig. 1.

In Fig. 2, there is shown a complete circuit diagram of a frequency modulation receiver from the final limiter stage to the audio output stage. The receiver may include radio frequency, converter and intermediate frequency stages as may be required for the particular application in which the receiver is used. The receiver may also include additional limiter stages with the limiter tube 35 being in final limiter stage. As stated above, the receiver is of the frequency modulation type and includes a frequency discriminator 36. The audio output from the frequency discriminator is applied through conductor 37 to the grid of the first audio output stage 38.

The audio output is also applied through conductor 40 to a filter, including condenser 41 and resistor 42, which selects noise in the output of the receiver in a band above the used signal. This noise is amplified in noise amplifier 43 and rectified in the diode connected triode 44. The rectified noise at the cathode of triode 44 is combined with a negative potential on conductor 45 derived from the grid of the limiter tube 35 and applied to the grid of the squelch tube 46. This tube is included in the same envelope as the triode 38 and amplifies the squelch voltage which is applied through resistor 48 to the grid of the audio amplifier stage 38 to cut off this stage when the noise voltage exceeds a predetermined value with respect to the reference voltage applied from the limiter grid. This squelch action is disclosed and claimed in Noble Patent 2,343,115.

As previously stated, the audio output of the discriminator is applied to the audio amplifier stage 38 and after amplification in this stage is applied through condenser 50 to the grid of the audio output stage 51. The audio output stage includes a pentode tube and is substantially the same as the audio ouput stage 15 in Fig. 1. Connected to the anode of the tube 51 is an output transformer 52 which may be connected to any sound reproducing means. To provide a bias for the tube 51, there is included a circuit including rectifier 53, resistor 54, condenser 55 and resistor 56. A negative voltage is applied from the grid of the tube 35 across filter 58 and through resistor 59 to the biasing circuit which normally produces a negative voltage across condenser 55 which is applied through resistor 56 to the grid of output tube 51.

As previously stated, the tube 51 is normally biased to a point at which it conducts only slightly, and thereby holds the anode current of this tube very low. However, when an audio signal is received and the squelch is open so that amplifier 38 applies an audio signal through condenser 50 to the grid of tube 51, the output of the tube 51 is applied through condenser 60 and resistor 61 to the rectifier 53 which applies current to condenser 55 for discharging the same so that the negative potential thereacross is reduced. This reduces the negative potential on the grid of output tube 51 so that increased current flows therein, with the action being accumulative until the tube 51 is fully conductive. It is apparent that the gain of the audio signal may be controlled by the potentiometer 62 which controls the direct current potential applied to the second limiter, and controls the bias to the first audio stage 38. Accordingly, the audio output level is controlled independently of the audio output stage 51, with the latter being used to provide full gain after an audio signal has been applied thereto for a short time interval.

Figure 3:
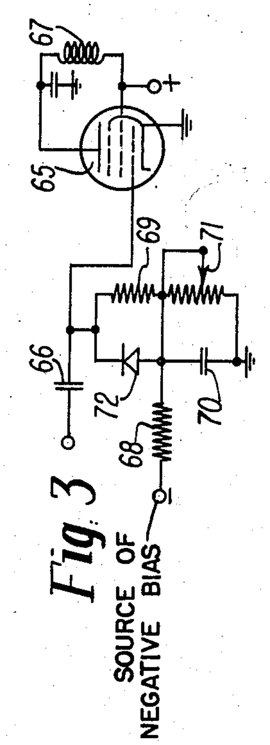
Fig. 3 illustrates another embodiment of the amplifier circuit in accordance with the invention.

A further embodiment of the invention is illustrated in Fig. 3 which includes an audio amplifier stage 65 to which an audio signal may be applied through condenser 66. The output from the amplifier may be applied to an output transformer 67 or any other suitable output coupling means. The amplifier 65 is normally held to a point where it conducts only slightly by action of a negative potential applied across resistors 68 and 71 and through resistor 69 to the control grid of tube 65. Resistors 68 and 71 form a voltage divider for providing the negative potential required to hold the tube 65 just at cut off. When, however, an audio signal is applied through condenser 66 this is rectified by the rectifier 72 to provide a positive potential opposing the negative potential so that the negative bias on the control grid of the tube 65 is reduced and the tube thereby conducts. In the circuit of Fig. 3, there is no cumulative action through the amplifier so that the components must be carefully adjusted to provide the desired operation. This may be accomplished by adjustment of potentiometer 71 of the voltage divider to control the negative potential applied to the control grid. The circuit of Fig. 3 may not be suitable for certain applications where relatively weak audio signals are applied to the output stage as such signals may not provide sufficient counteracting positive voltage to permit the audio output tube to conduct fully. However, in some applications this circuit may be entirely satisfactory and because of its simplicity may be preferred to the circuit of Figs. 1 and 2.

It is, therefore, seen that an amplifier stage is provided which is normally substantially cut off so that very little current is drawn thereby. The negative bias which holds the tube to a point where it conducts only very slightly is counteracted by a positive voltage developed from the applied signal, so that when a signal is applied the tube is rendered conductive to amplify the signal. By utilizing the signal at the output of the amplifier, the effect can be made cumulative so that the tube will soon be rendered fully conducting to provide full amplification.

Although the circuit has been illustrated for use with the audio output stage of a radio receiver which draws heavy current and in which it may be desired to conserve current especially in instances wherein signals are received only intermittently, it is obvious that such an amplifier stage may be advantageous in many other applications. The circuit required for providing the automatic bias control is very simple and is completely reliable so that maintenance problems are not encountered.

We claim:

1. In a radio receiver which operates continuously for receiving a modulated carrier wave which is present only part of the time, and which receiver includes a limiter stage having a point at which a negative potential is developed, audio detecting means, and an audio output amplifier stage which when operative utilizes a large part of the energy required by the entire receiver, said audio detecting means including squelch means which produces an audio signal in response to the modulated carrier wave and which produces no signals in the absence of the modulated carrier wave, said amplifier stage including in combination an electron discharge valve having at least a cathode, a grid and an anode, an input circuit connecting said audio detecting means to said cathode and said grid of said amplifier stage for applying to said amplifier stage audio signals developed in the receiver, energy supply means connected to said cathode and said anode for rendering said anode positive with respect to said cathode, and a biasing circuit connected between said cathode and said control grid for controlling the conductivity of said valve, said biasing circuit including a portion connected to the point in the limiter stage having a negative potential for applying to said grid a bias negative with respect to said cathode for holding said valve conductive below the full signal operating level so that relatively small current is drawn from said energy supply means, said biasing circuit including a rectifier portion coupled to said anode of said valve for receiving amplified audio signals therefrom and for rectifying the same to produce a positive potential which opposes said negative bias and reduces the same so that relatively large current is drawn by said valve from said supply means, whereby said valve is rendered fully operative in response to audio signals developed in the receiver for amplifying the same, and said valve is substantially cut off in the absence of audio signals to thereby substantially reduce the energy consumed by the receiver.

2. In a radio receiver which operates continuously for receiving a modulated carrier wave which is present only part of the time, and which receiver includes a limiter stage having a point at which a potential is developed, audio detecting means, and an audio output amplifier stage, which when operative utilizes a large part of the energy required by the entire receiver, said audio detecting means including squelch means which produces an audio signal in response to the modulated carrier wave and which produces no signals in the absence of the modulated carrier wave, said amplifier stage including in combination an electron valve having at least first and second input electrodes and an output electrode, an input circuit connecting said audio detecting means to said input electrodes of said amplifier stage for applying to said amplifier stage audio signals developed in the receiver, energy supply means connected to said electrodes of said valve for rendering the same operative, and a biasing circuit connected between said input electrodes for controlling the conductivity of said valve, said biasing circuit including a portion connected to the point in the limiter stage for applying to said valve a bias for holding said valve conductive below the full signal operating level so that relatively small current is drawn from said energy supply means, said biasing circuit including a rectifier portion coupled to said output electrode of said valve for receiving amplified audio signals therefrom and for rectifying the same to produce a potential which opposed said bias and reduces the same so that relatively large current is drawn by said valve from said supply means, whereby said valve is rendered fully operative in response to audio signals developed in the receiver for amplifying the same, and said valve is substantially cut off in the absence of audio signals to thereby substantially reduce the energy consumed by the receiver.

References Cited in the file of this patent

UNITED STATES PATENTS

| | | |
|---|---|---|
| 1,859,565 | Keith | May 24, 1932 |
| 1,928,410 | Cook | Sept. 26, 1933 |
| 2,115,825 | Morehouse | May 3, 1938 |
| 2,279,095 | Sohnemann | Apr. 7, 1942 |
| 2,343,115 | Noble | Feb. 29, 1944 |
| 2,381,754 | Jadraque | Aug. 7, 1945 |
| 2,509,381 | Werner et al. | May 30, 1950 |